(12) United States Patent
Hsu et al.

(10) Patent No.: US 7,837,374 B2
(45) Date of Patent: Nov. 23, 2010

(54) LIGHT-EMITTING DEVICE

(75) Inventors: Chia-Liang Hsu, Hsinchu (TW); Shu-Ting Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 394 days.

(21) Appl. No.: 12/003,880

(22) Filed: Jan. 3, 2008

(65) Prior Publication Data
US 2008/0165539 A1  Jul. 10, 2008

(30) Foreign Application Priority Data
Jan. 9, 2007    (TW) .............................. 96100867 A
Apr. 4, 2007    (TW) .............................. 96112300 A

(51) Int. Cl.
*F21V 33/00*  (2006.01)

(52) U.S. Cl. .................. 362/612; 362/800; 362/249.02; 362/84

(58) Field of Classification Search .................. 362/800, 362/612, 555, 249.02
See application file for complete search history.

(56) References Cited

U.S. PATENT DOCUMENTS

| | | | | |
|---|---|---|---|---|
| 5,220,725 | A * | 6/1993 | Chan et al. | 29/874 |
| 6,452,217 | B1 * | 9/2002 | Wojnarowski et al. | 257/99 |
| 7,157,853 | B2 * | 1/2007 | Imai et al. | 313/512 |
| 2005/0236628 | A1 | 10/2005 | Matsuura | |
| 2007/0171673 | A1 | 7/2007 | Song et al. | |
| 2007/0195524 | A1 * | 8/2007 | Seo et al. | 362/228 |

* cited by examiner

*Primary Examiner*—Laura Tso
(74) *Attorney, Agent, or Firm*—Bacon & Thomas, PLLC

(57) ABSTRACT

This application relates to a light-emitting device comprising a light channel having an upper surface, a lower surface opposite to the upper surface, an inner surface intersecting with each of the upper and lower surface by different angles, and an escape surface; and a light-emitting element having a bottom surface substantially parallel to the inner surface and emitting light traveling inside the light channel toward the escape surface. In an embodiment, the escape surface of the light-emitting device is an inclined plane with lens array thereon.

20 Claims, 25 Drawing Sheets

LIGHT-EMITTING DEVICE

TECHNICAL FIELD

The invention relates to a light-emitting device, and more particularly to a side emitting light-emitting device and the application thereof.

REFERENCE TO RELATED APPLICATION

This application claims the right of priority based on TW application Ser. No. 096100867, filed Jan. 9, 2007; and TW application Ser. No. 096112300, filed Apr. 4, 2007, and the contents of which are hereby incorporated by reference.

DESCRIPTION OF BACKGROUND ART

FIG. 10 illustrates a lateral cross section of a known side view light-emitting diode 50, including a base 51, a chip 53 mounted on the base 51, a upper sidewall 52A and a bottom sidewall 52B for blocking and/or reflecting light from the chip 53 (some types of light-emitting diodes have right and left sidewalls), and filling material 54.

Light striking the sidewalls 52A and 52B at about 90 degree (as shown by the arrow) likely moves back and forth between the chip 53 and the upper sidewall 52A, and/or the chip 53 and bottom sidewall 52B, and accordingly is confined within the light-emitting diode. Furthermore, due to the miniaturizing light-emitting diode 50, the light penetrating the decreasing thickness may result in a leakage. In practice, by above reason or others, the light extraction efficiency of a packaged chip likely drops 40% in comparison with a bare chip.

Moreover, the decreasing spacing between the sidewalls of the miniaturizing light-emitting diode also causes the difficulty in filling the space with the filling material 54 and generates voids accordingly. Therefore, the light may be trapped inside the voids, and the light extraction efficiency is reduced.

SUMMARY OF THE DISCLOSURE

A light-emitting device according to the present invention includes a light channel formed on a base, and a light-emitting unit, wherein the light channel includes an upper surface, a lower surface opposite to the upper surface, an inner surface intersecting with the upper surface and the lower surface at different intersecting angles, and a light output surface opposite the inner surface; and the light-emitting unit is on the inner surface and emits light to propagate inside the light channel towards the light output surface.

The light-emitting device according to the present invention further includes a first reflecting layer covering the inner surface, a conducting layer covering the first reflecting layer and electrically connecting to the light-emitting unit, and a second reflecting layer on a side opposite to the lower surface. The preferable embodiment further discloses an insulating layer between the first reflecting layer and the conducting layer. The light channel can be filled with a filling material.

In one embodiment, the light output surface is substantially parallel to the inner surface, or perpendicular to at least one of the upper surface and the lower surface, or intersects with the upper surface and the lower surface at different intersecting angles. The light output surface may be a curved surface. Optionally, the upper surface is substantially parallel to the lower surface. In addition, at least a portion of the inner surface or the lower surface may be a curved surface. A cut is formed on the fringe of the upper surface in order to avoid metallic residuals generated during wafer cutting, or the sidewall of the light-emitting unit being polluted by the overflowed solder.

In another embodiment, the conducting layer includes a first conducting layer and a second conducting layer. The light-emitting unit has electrodes electrically connecting to the first conducting layer and the second conducting layer respectively.

Furthermore, the light-emitting unit emits two or more colors of lights, or red, blue and green lights. The light-emitting device further includes a wavelength converting material for receiving light from the light-emitting unit and generating excited light. In one embodiment, the wavelength converting material overlays directly on the light-emitting unit.

The light-emitting device of the present invention can be coupled to a display, and a light guide plate is used to receive light from the light-emitting unit and change its direction. The contour of the light input surface of the light guide plate corresponds preferably to that of the light output surface. Specifically speaking, the light-emitting device further includes a reflecting layer on a side of the light guide plate for reflecting light, an optical film, and a liquid crystal layer, wherein the optical film and the liquid crystal layer are on the other side of the light guide plate.

DETAILED DESCRIPTION OF PREFERRED EMBODIMENTS

Figure 1A:
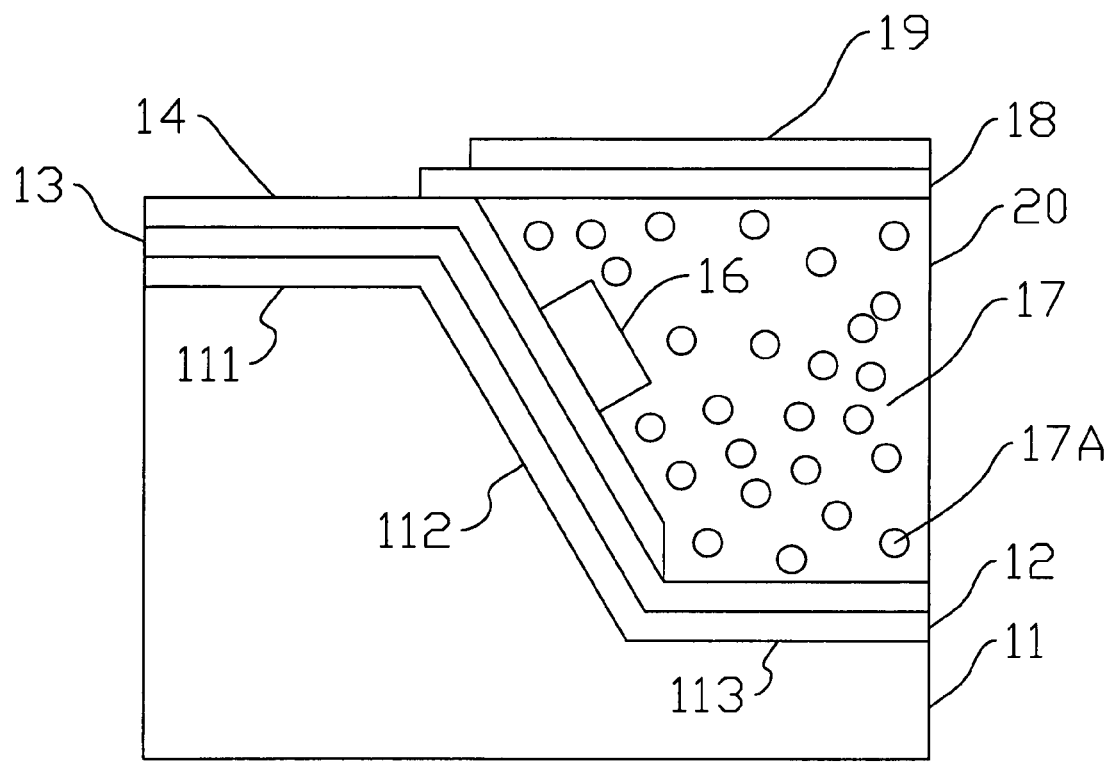
FIG. 1 illustrates a light emitting device according to an embodiment of the present invention.

As shown in FIG. 1A, a light-emitting device includes a base 11, a first reflecting layer 12, a first insulating layer 13, a conducting layer 14, a light-emitting unit 16, a filling material 17, a wavelength converting material 17A, a second insulating layer 18, and a second reflecting layer 19.

In one embodiment, the base 11 is made of silicon, and has an upper terrace 111, an incline 112, and a lower terrace 113. The first reflecting layer 12, the first insulating layer 13, and the conducting layer 14 are sequentially formed on the incline 112, wherein the first reflecting layer 12 and the first insulating layer 13 overlay the upper terrace 111, incline 112, and the lower terrace 113. The conducting layer 14 overlays the upper terrace 111 and the incline 112. The light-emitting unit 16, such as a light-emitting diode chip, is mounted on the conducting layer 14. The second insulating layer 18 and the second reflecting layer 19 are formed on a side of the light channel opposite to the lower terrace 113. The filling material 17 is formed between the first insulating layer 13 and the second insulating layer 18.

The first reflecting layer 12 and the second reflecting layer 19 are capable of reflecting or/and scattering light, and the material thereof includes but not limited to Au, Ag, Cu, Ti, an alloy of aforementioned materials, a stacking layer of aforementioned materials, and a distributed Bragg reflector (DBR). The material of the first insulating layer 13 and the second insulating layer 18 includes but not limited to $SiO_2$, epoxy, benzocyclobutene (BCB), and $Si_xN_y$. The insulating layer preferably has a thickness that the light can pass through and reach the reflecting layer. The material of the conducting layer 14 includes but not limited to Au, Ag, Al, Cu, W, Sn, and Ni.

The filling material 17 includes but not limited to epoxy, acrylic resin, COC, PMMA, PC, polyetherimide, fluorocarbon polymer, and silicone.

Figure 1B:
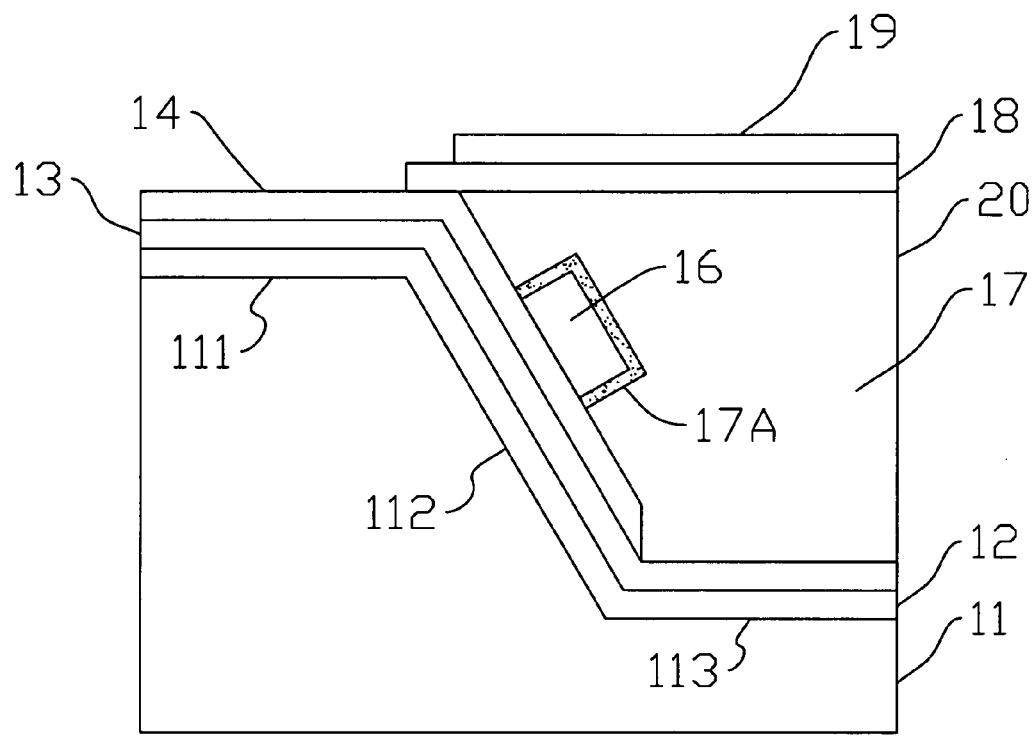

The filling material 17 may also includes the wavelength converting material 17A, such as phosphor, which can be excited by the light from the light-emitting unit 16 and generates light with a different wavelength. As shown in FIG. 1B, the phosphor layer can overlay directly on any light output surface of the light-emitting unit 16. The phosphor layer thickness may be identical or varied on each of the light output surfaces according to the required light field or color. Applicant's Taiwan patent application, SN. 093126439, which discloses related technology, is incorporated herein by reference.

The light-emitting unit 16 can be a horizontal or vertical type light-emitting diode or chip. A horizontal type light-emitting diode has a p-electrode and an n-electrode formed on the same side of a substrate or a carrying layer for carrying the p- and n-electrodes. A vertical type light-emitting diode has a p-electrode and an n-electrode formed on the opposite sides of a substrate or a carrying layer.

Figure 2A:
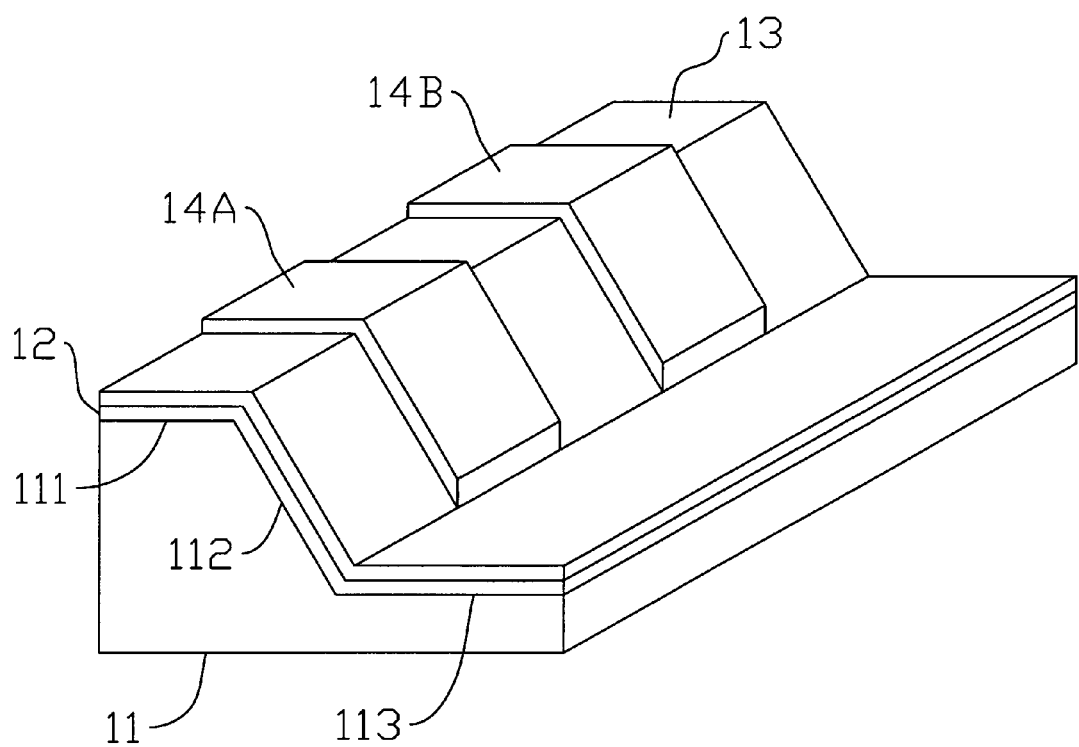
FIGS. 2A and 2B illustrate a perspective view of a part of a light emitting device according to a preferable embodiment of the present invention.
Figure 2B:
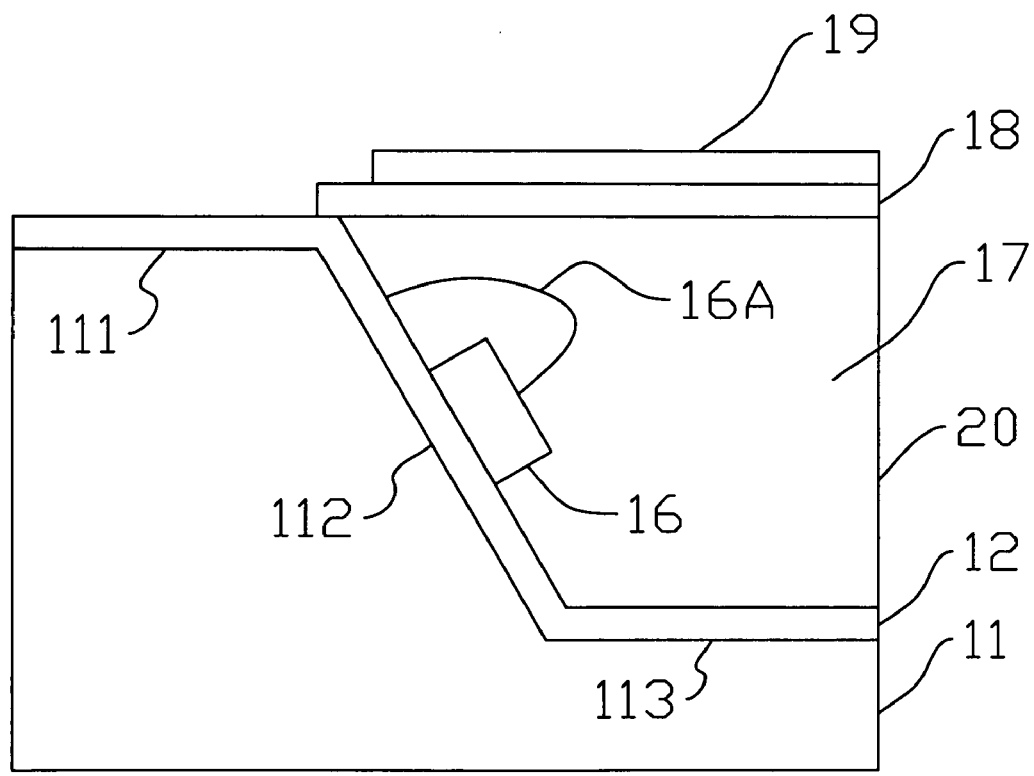

The details of the conducting layers of the present invention are shown in FIG. 2A. The conducting layers 14A and 14B are formed on the insulating layer 13, and electrically connected to the p- and n-electrodes respectively. In detail, one of the p- and n-electrodes of the vertical type light-emitting diode is coupled to the conducting layer 14A, and the other is electrically connected to the conducting layer 14B via a wire or other connecting means. The p- and n-electrodes of the horizontal type light-emitting diode are respectively coupled to the conducting layers 14A and 14B, i.e. mounted to the conducting layer in a flip-chip fashion. When the horizontal type light-emitting diode is carried by an insulating substrate, the insulating substrate can be directly put on one of the conducting layer 14A and 14B, or span the two conducting layers, and the p- and n-electrodes are electrically connected to the conducting layer 14A and 14B by wiring or other connecting means respectively. The light-emitting diode or chip having an insulating substrate can also be disposed directly on the incline 112, the first reflecting layer 12, or the insulating layer 13. As shown in FIG. 2B, the reflecting layer 12 is made of conducting material(s) and connected to a wiring 16A, i.e. the light-emitting unit 16 is electrically connected to an outer circuit through the reflecting layer 12. The covering area of the first reflecting layer 12 and/or the insulating layer 13 can be adjusted in view of the requirement.

Figure 3A:
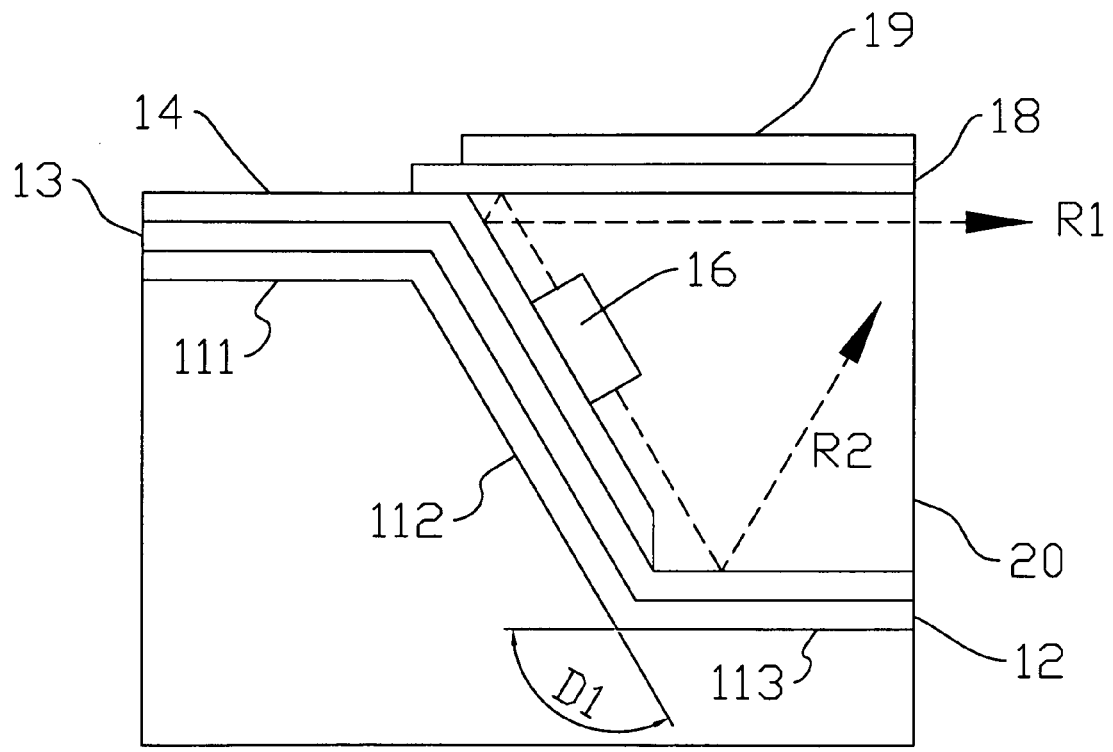
FIGS. 3A and 3B illustrate a drawing of light path according to an embodiment of the present invention.
Figure 3B:
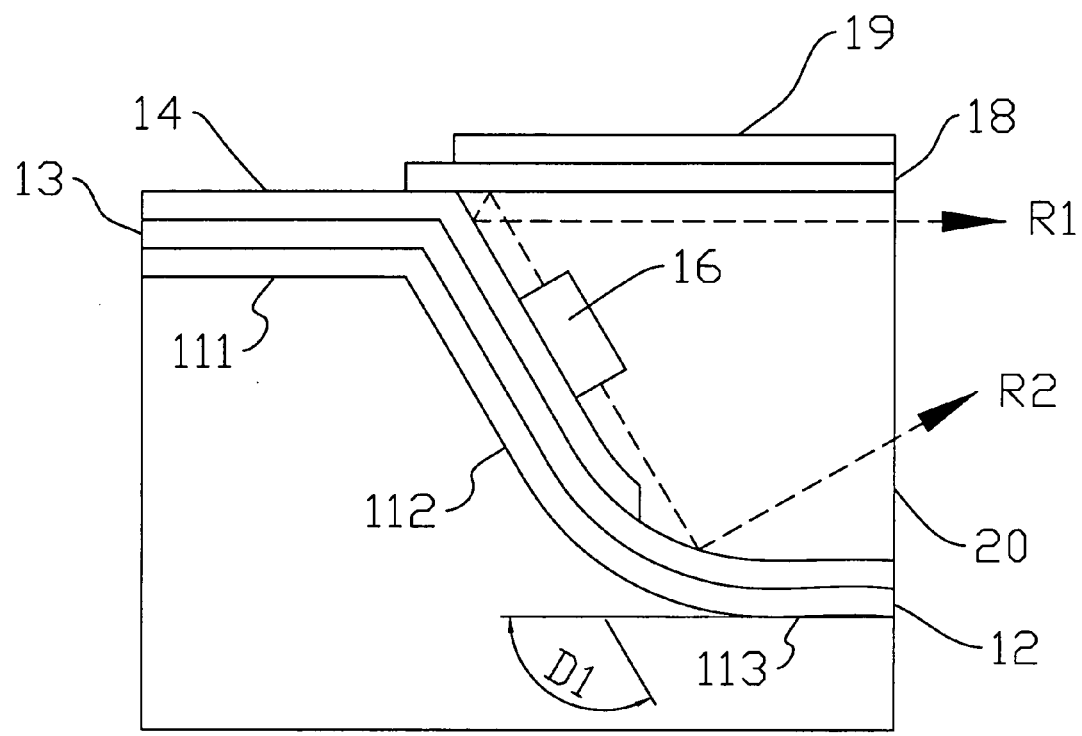

As shown in FIG. 3A, according to an embodiment of the present invention, parts of the light from the lateral side of the light-emitting unit 16 strike the first reflecting layer 12 and the second reflecting layer 19 respectively. Because the conducting layer 14 on the incline 112 intersects with the first conducting layer 12 and the second reflecting layer 19 at different intersecting angles, the light is reflected to different directions. In one embodiment, the intersecting angle D1 between the inclines 112 and the lower terrace 113 is 120 degree, and the intersecting angle between the inclined portion of the conducting layer 14 and the first reflecting layer 12 is D1. The light R1 shooting to the second reflecting layer 19 leaves the light-emitting device 10 after two reflections. The light R2 shooting to the first reflecting layer 12 leaves the light-emitting device 10 after one time reflection or reflection(s) between the first reflecting layer 12 and the second reflecting layer 19. As shown in FIG. 3B, the portion between incline 112 and the lower terrace 113 is such as a curved surface, which has an intersecting angle D1. The curved surface has a constant curvature, or a varying curvature, which is a space function of two or three dimensions. According to the design of the present invention, the light confined in the package structure is released, and the light extraction efficiency is hence improved.

Figure 4A:
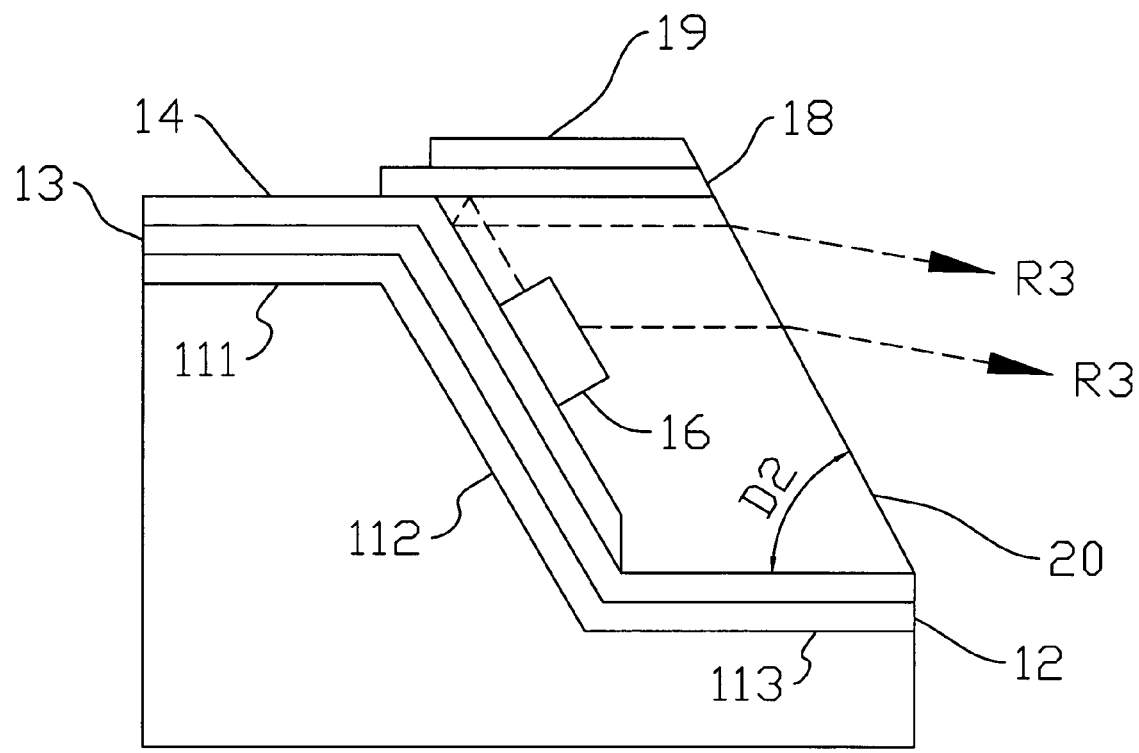
FIGS. 4A~4G illustrate a light-emitting device according to another embodiment of the present invention.
Figure 4B:
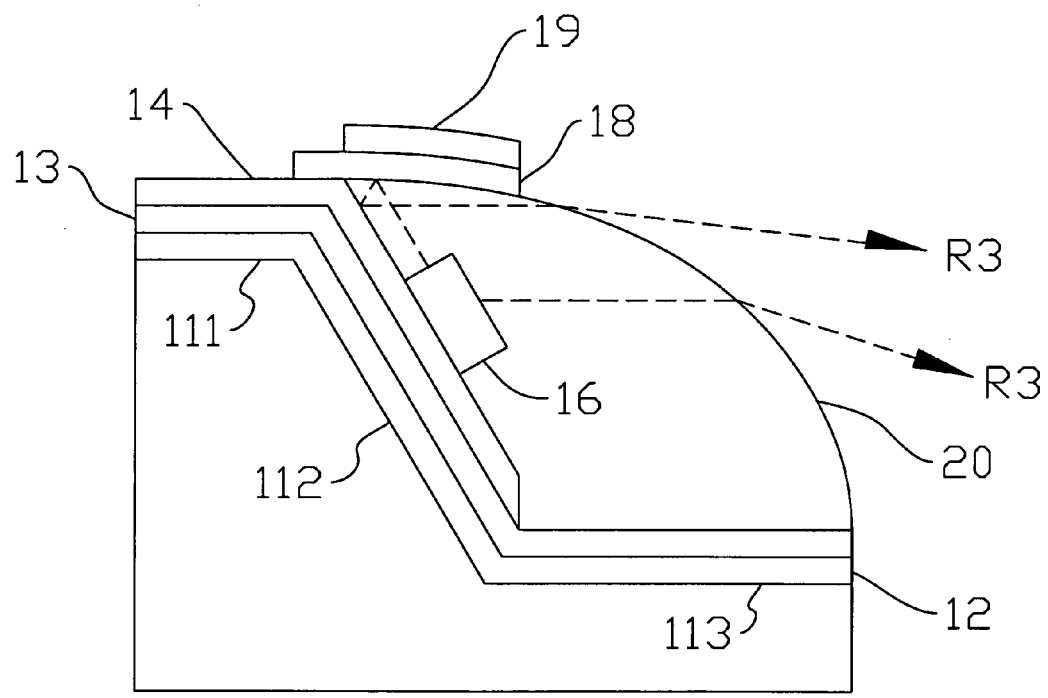
Figure 4C:
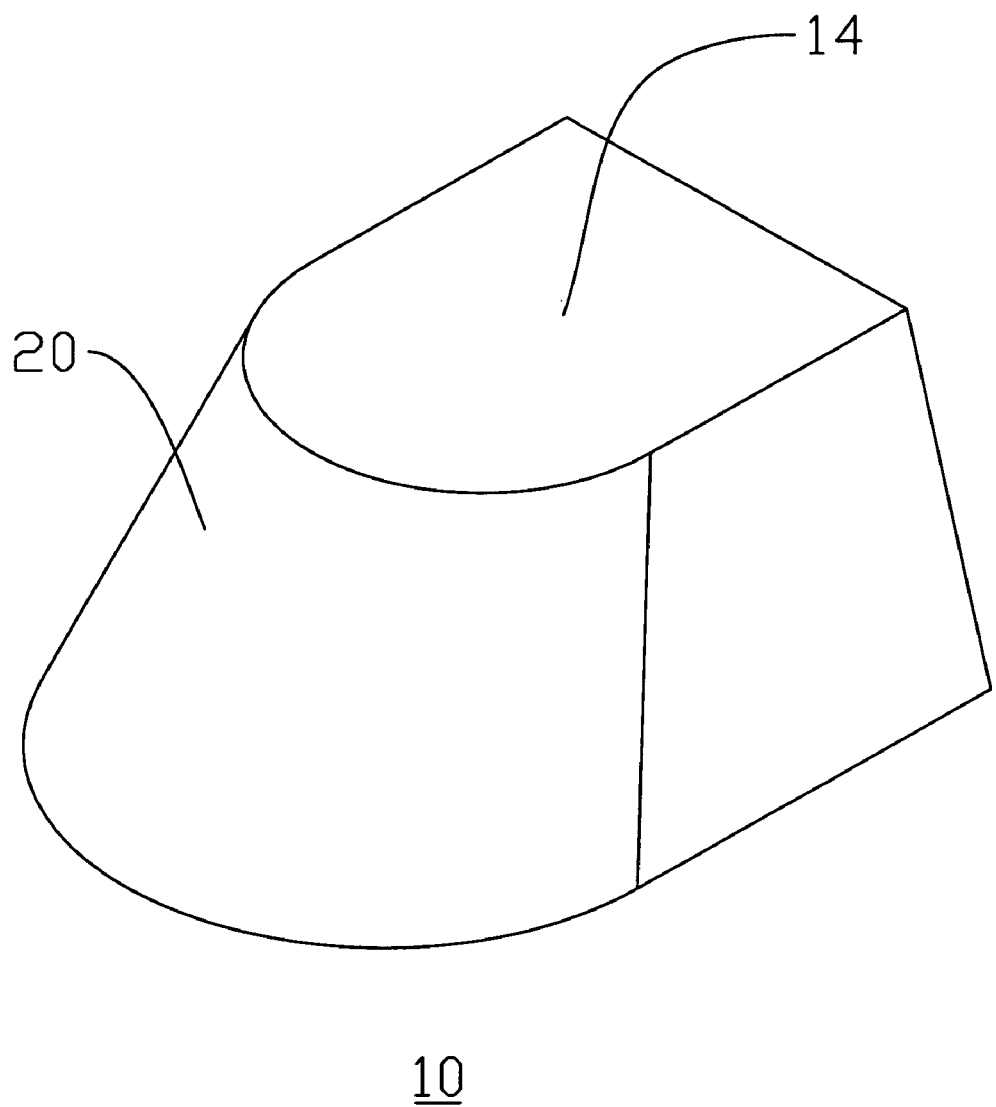

As shown in FIG. 4A, the light output surface 20 of the light emitting device 10 is parallel to the incline 112, or inclines relative to the lower terrace 113 by D2 degree. The light is refracted after passing through the inclined light output surface 20, and changes the direction; therefore, the light can be directed to a predetermined direction under a properly set degree. In another embodiment, assuming degree D2=60°, the light field or the light R3 moves downward. As shown in FIGS. 4B and 4C, the light output surface 20 of the light-emitting device 10 is a curved surface; the curved surface has a constant curvature, or a varying curvature, which is a 2D or 3D space function. The curved surface may result in various light fields. Under a properly designed curved surface, even without the second insulating layer 18 and the second reflecting layer 19, the light also leaves out the light output surface 20 after one or many times of total reflections on the boundary between the curved surface and the environmental medium.

Figure 4D:
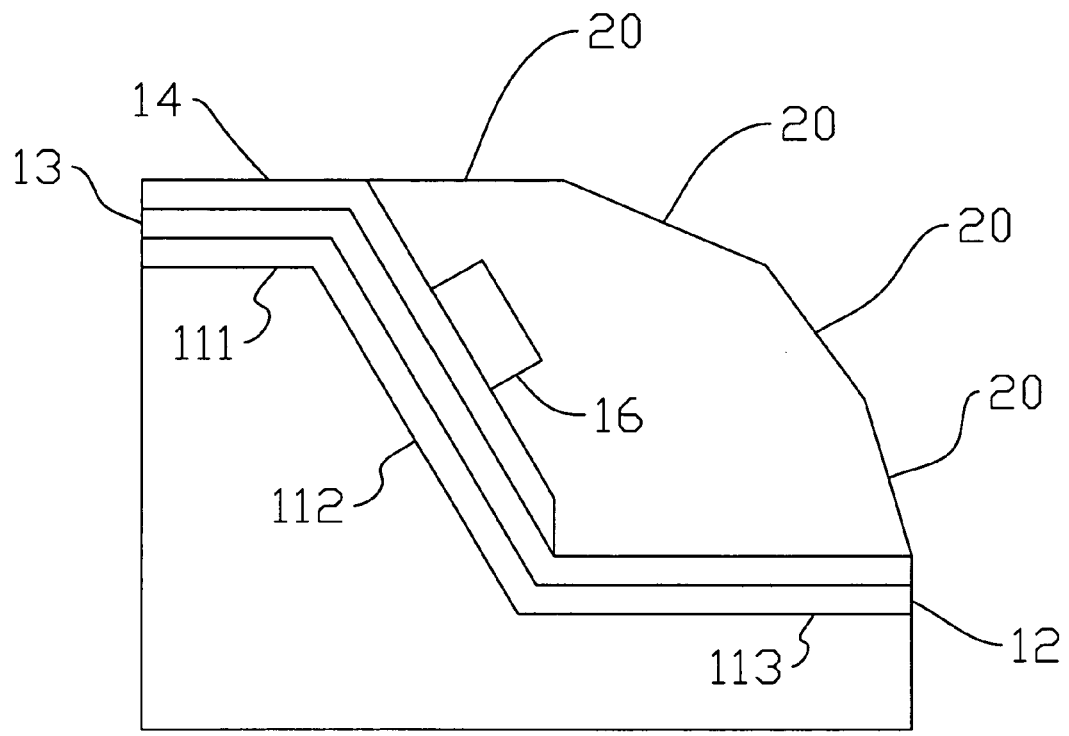
Figure 4E:
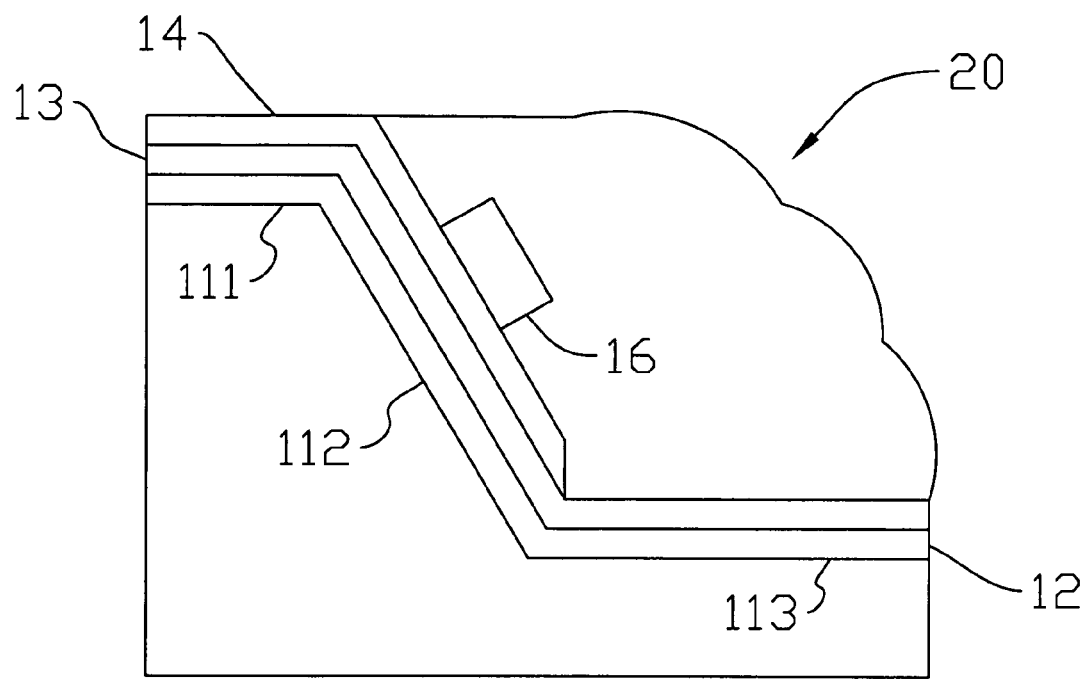
Figure 4F:
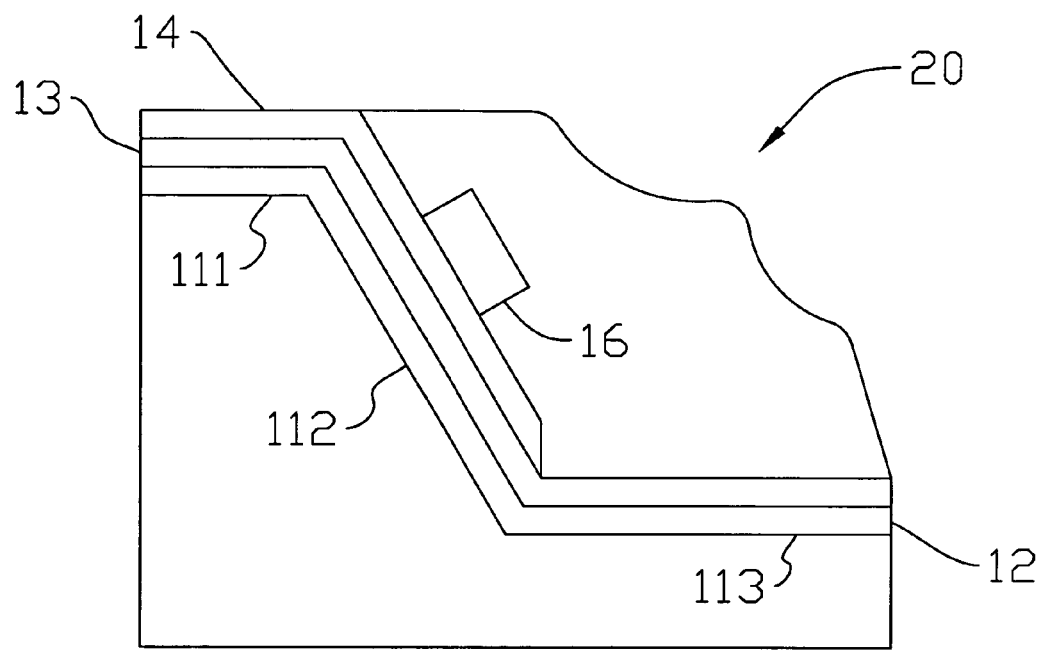
Figure 4G:
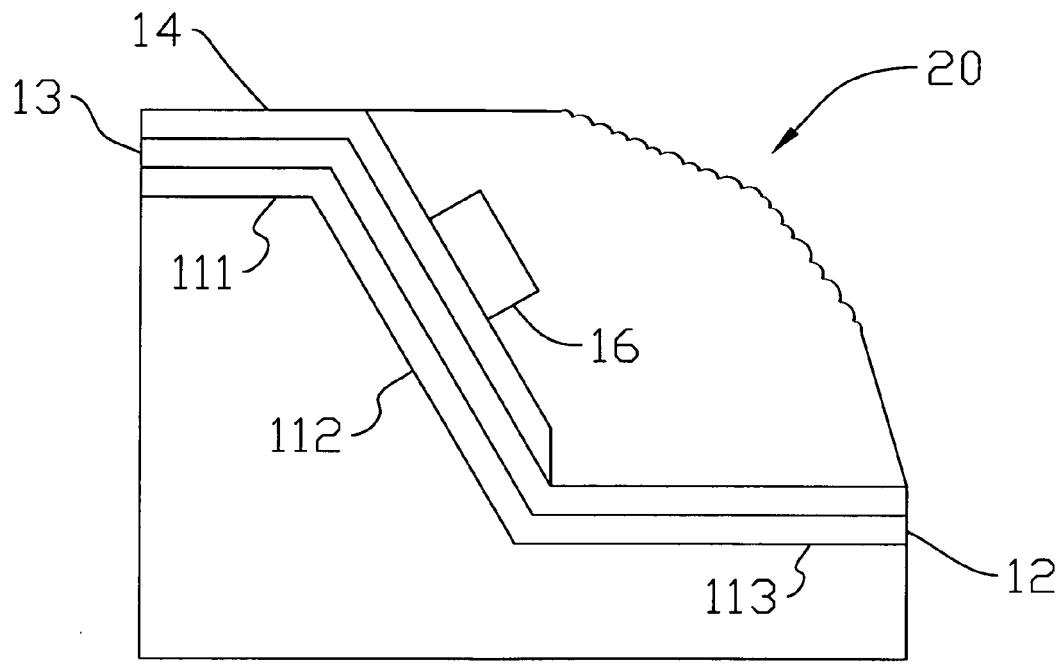

As shown in FIG. 4D, in another embodiment of the present invention, the light-emitting device 10 has several light output surfaces 20. The neighboring surfaces intersect respectively with a reference plane, such as the lower terrace 113, at different angles; therefore, the light incident at the same angle is refracted out of the several light output surfaces at different angles. Moreover, when the angle between the light output surface 20 and the lower terrace 113 becomes smaller, the light field tends to move downward, and on the contrary, the light field tends to move upward. The contour of the light output surfaces may be a part of a polyhedron. In other embodiments, at least part of the light output surface 20, or several light output surfaces 20 is/are constructed in a formation including a curved surface, a rough surface, and a lens, as shown in FIGS. 4E~4G. The overall light field of the light-emitting device 10 can be controlled by combining different angles and types of light output surfaces.

Figure 5A:
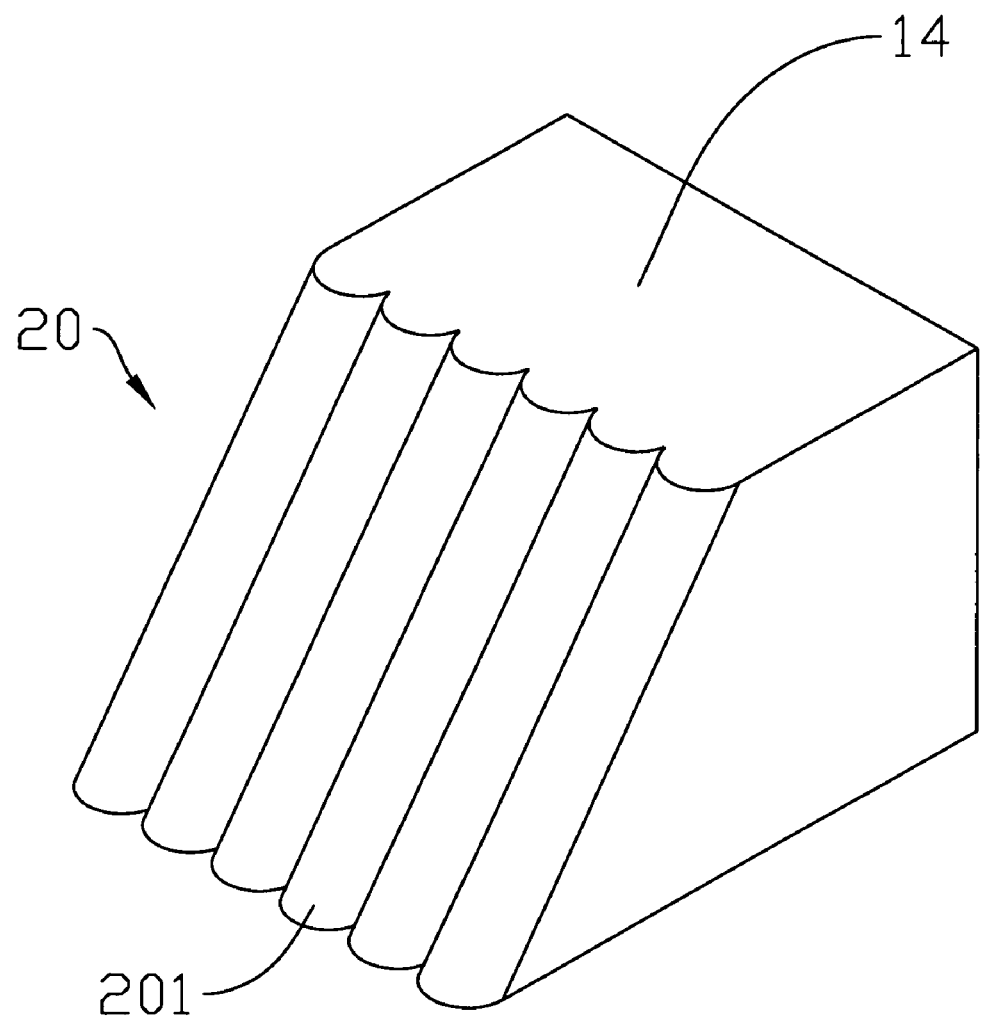
FIGS. 5A~5C illustrates a light-emitting device according to a further embodiment of the present invention.

The light output surface 20 of aforementioned embodiments further include two or more micro lenses 201. As shown in FIG. 5A, lenses 201 are laterally arranged on the light output surface 20. The light leaves the light output surface 20 of the light-emitting device via the guidance of the lenses 201. By using the lenses 201, the light-emitting device 10 can display a light field with a larger angle or well-mixed colors of lights. Provided two or more colors of lights are emitted by the light-emitting unit 16 of the light-emitting device 10, the color lights can be well mixed by the lenses 201. In addition, the lenses 201 also facilitate the mixture of a plurality of light rays. However, the lenses may be vertically arranged according to the requirement. The lens 201 can be a convex or a concave. The radius of the lens 201 is between 50 μm~60 μm.

Figure 5B:
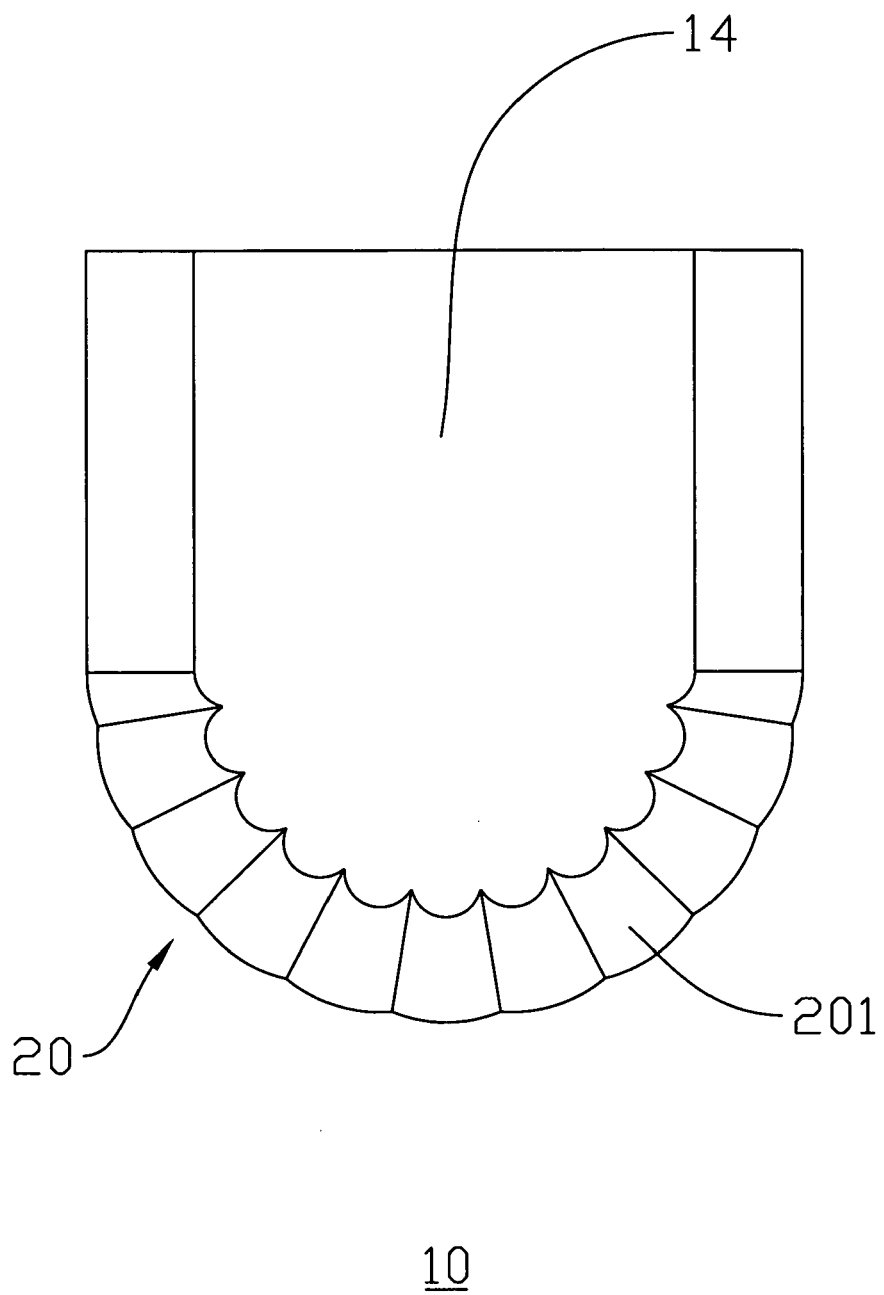
Figure 5C:
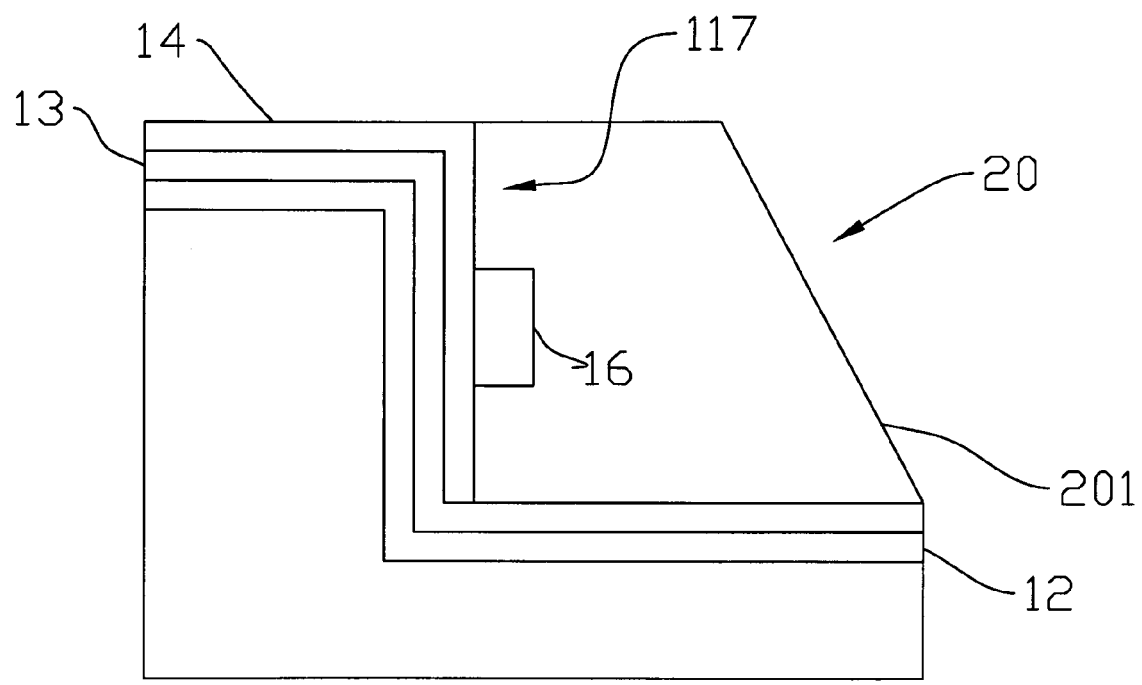

Furthermore, FIG. 5B illustrates a top view of a light-emitting device 10, as shown in FIG. 4C, having lenses 201. The radius of the lens 201 changes along an extending path. In the present case, the radius of the lens 201 increases from top to down. In addition, as shown in FIG. 5C, in the light-emitting device 10 having an array of lens 201, the inner surface 117 of the light channel may be a vertical surface and is not limited to an incline.

Figure 6:
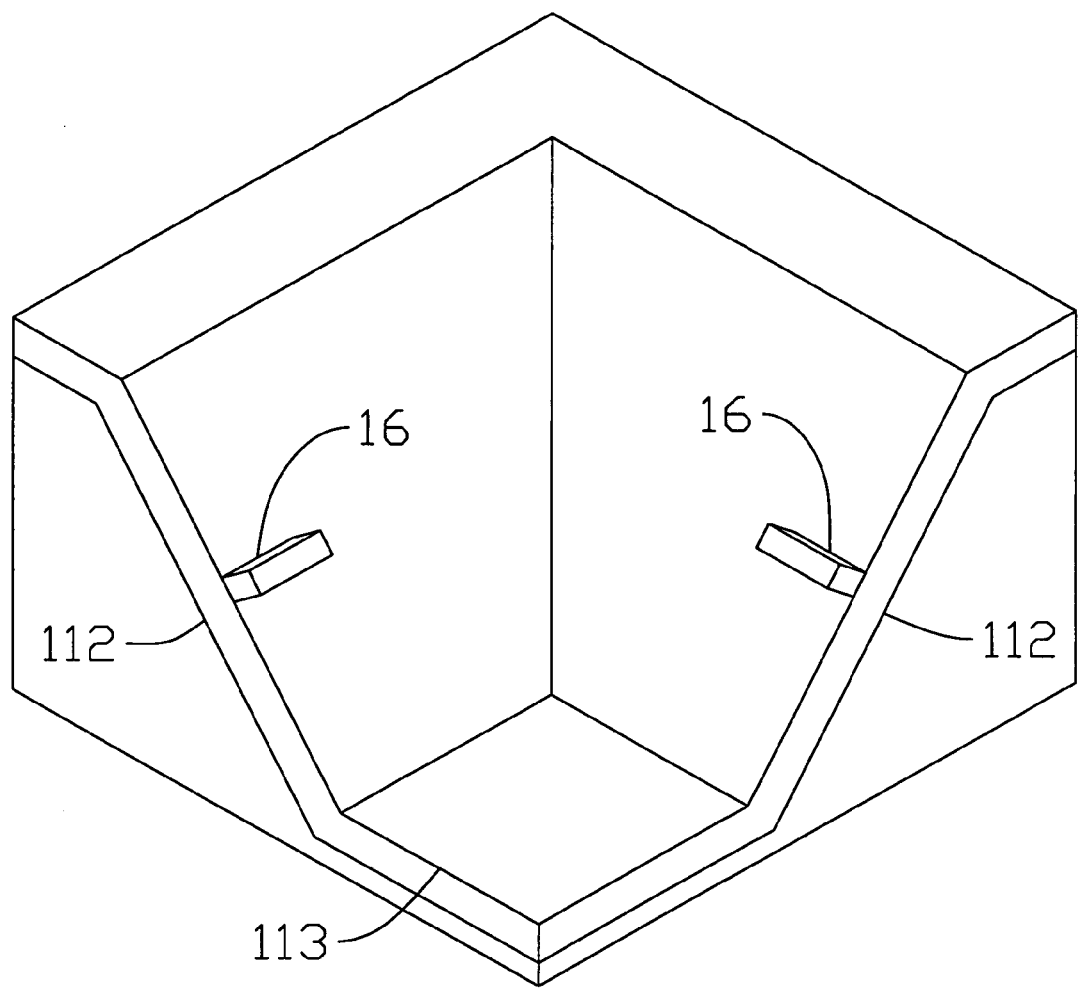
FIG. 6 illustrates a light-emitting device according to an embodiment of the present invention.

In the present invention, the light-emitting unit 16 of the light-emitting device 10 is not limited to be disposed on a single side of the light channel, but on any side of the light channel. As shown in FIG. 6, the light channel includes two or more inclines 112 on different sides thereof. Arbitrary quantity of the light-emitting unit 16 can be disposed on the incline 112. Provided two inclines 112 is disposed opposite to each other, the reflecting layer formed on the incline 112 can reflect the light from the opposite side upward. Provided each side of the light channel includes an incline 112, and the reflecting layer is formed on the incline 112 and the lower terrace 113, the light from the light-emitting unit 16 on each of the incline 112 is reflected upward by the reflecting layer on the incline 112.

According to another embodiment of the present invention, the light-emitting device 10 includes two or more light-emitting units 16 which can emit colorful light having a single color, multi-colors, non-visible wavelength, or a combination of the aforementioned lights. The arrangement of the light-emitting unit 16 is determined by the electrode design of an individual light-emitting unit 16, which is described in detail in the description of FIG. 2B. White light can be mixed up by using red, blue, and green light-emitting units 16, or two light-emitting units 16 having complementary colors.

Figure 7A:
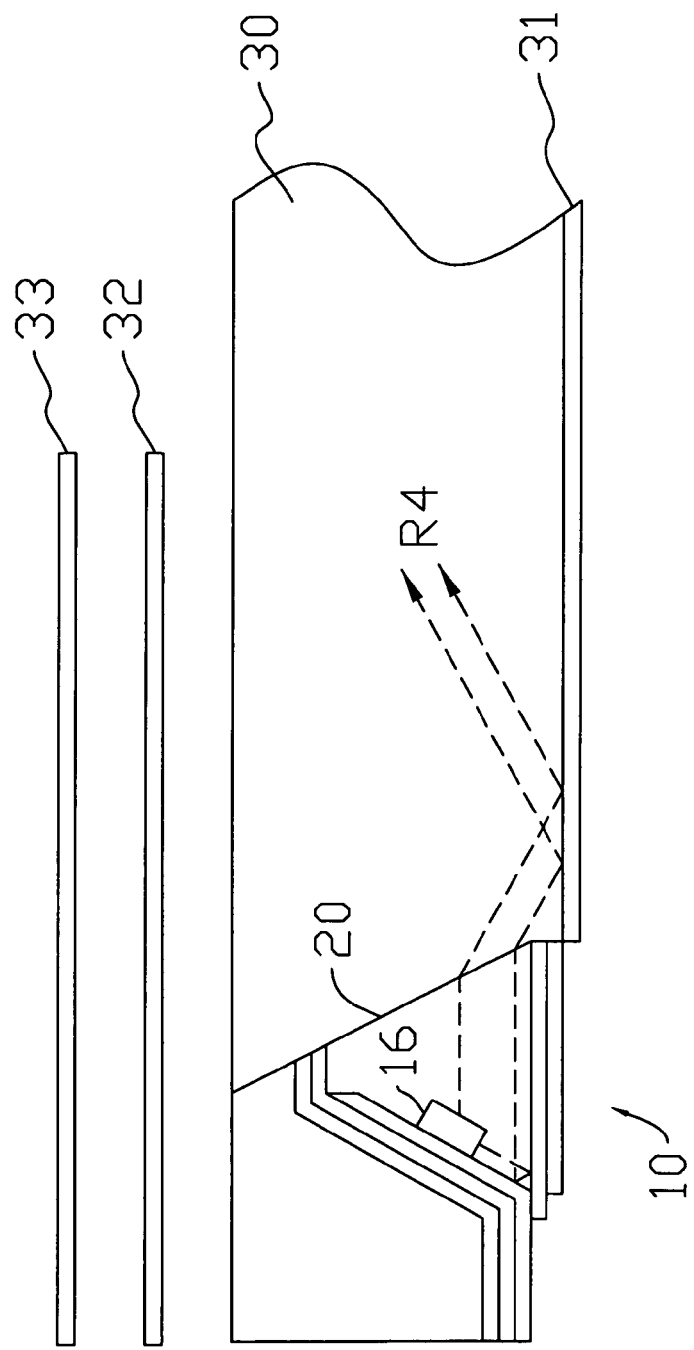
FIGS. 7A and 7B illustrate a display using a light-emitting device according to the present invention.

The aforementioned design is beneficial to apply the light-emitting unit to a product requiring a particular light field, such as a backlight module of a liquid crystal display. As shown in FIG. 7A, an edge type liquid crystal display essentially includes a light guide plate 30, a reflecting film 31, an optical film 32, and a liquid crystal layer 33. The light input surface of the light guide plate 30 has a geometry changing with the light output surface 20 of the light-emitting device 10, In present case, the contours of the light input surface and the light output surface are identical, but the present invention is not limited to such implementation, other disposition well adapted to the light-emitting device is acceptable. The light from light-emitting unit 16, which is refracted at the light input surface and then moves to the bottom of light guide plate, is reflected to the optical film 32 and liquid crystal layer 33 by the reflecting film 31. In the present embodiment, the angle of the light output surface 20 is different from that disclosed in above embodiments in order to fit the design of the display.

Figure 7B:
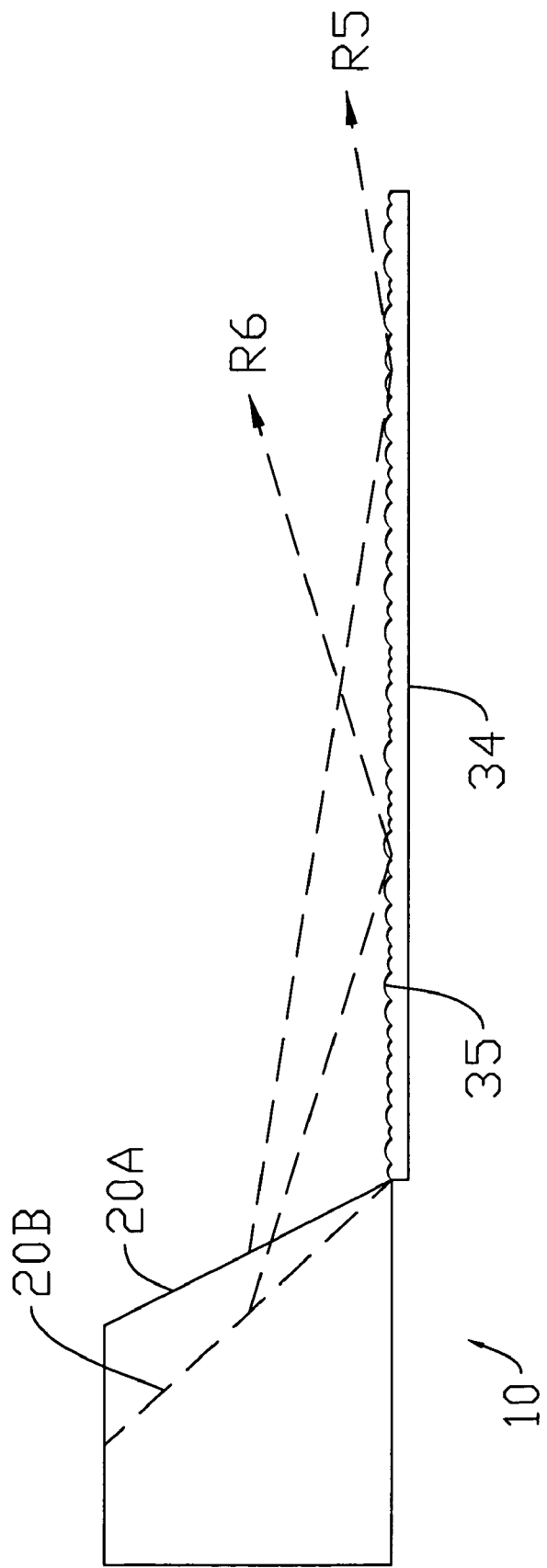

The light output angle of the light-emitting device 10 can be adjusted by tuning the inclined angle of the light output angle relative to a reference plane. The horizontal incident light can reach a farther position through a light output surface having a larger inclined angle; on the contrary, the light through the light output surface having a smaller inclined angle can only reach a closer position. As shown in FIG. 7B, two light output surfaces 20A and 20B having different angles are arranged on the same side of the reflector 34, wherein, the two light output surfaces 20A and 20B can be formed on a single or separate light-emitting device 10. The light (light field) R5 through a larger angle light output surface 20A is refracted to a position distant from the light output surface; while the light (light field) R6 through a smaller angle light output surface 20B is refracted to a position near the light output surface. The light is reflected by the reflector 34 to a direction leaving away the reflector. By the design, a uniform light distribution can be realized on a predetermined region, even without using the light guide plate of FIG. 7A. The light output surfaces having different light output angles can be designed into several or individual light-emitting device(s). Moreover, the light-emitting device can be disposed on one or two or more edges of the reflector.

In addition, the surface of the reflector 34 can be a rough surface, which has protrusions and depressions. The light striking the roughing surface is scattered in an arbitrary direction. In one embodiment, the distribution density of the protrusions and depressions is higher in the position leaving away the light output surface. However, the protrusions and depressions can also distribute uniformly or randomly on the surface 35. The protrusion and depression can be formed in a formation including dot, stripe, hole, or the combination thereof.

The manufacture process of present invention is described below.

Figure 8A:
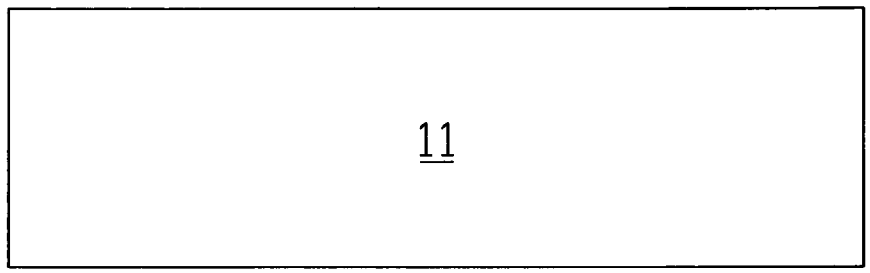
FIGS. 8A~8I illustrate a process flow according to a preferable embodiment of the present invention.
Figure 8B:
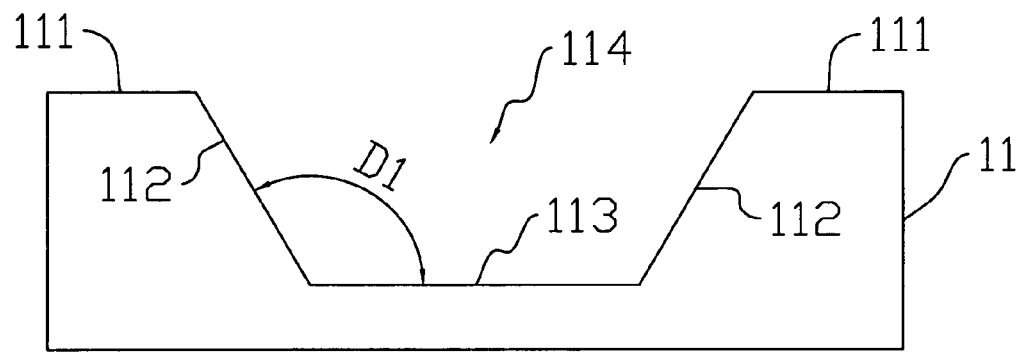
Figure 8C:
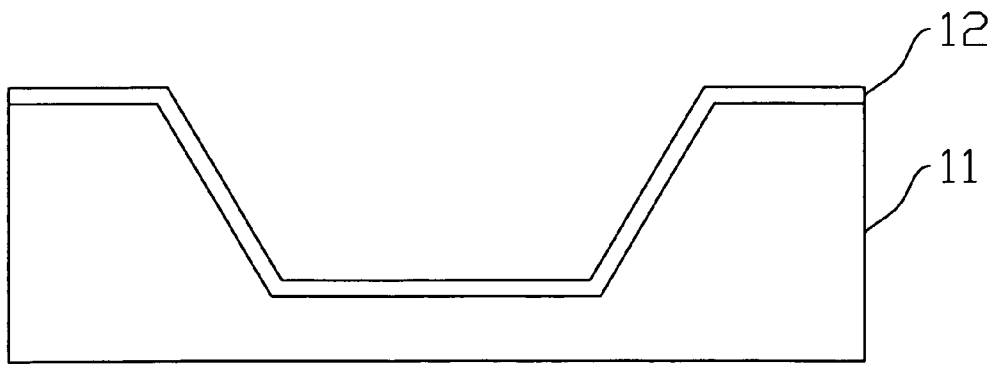
Figure 8D:
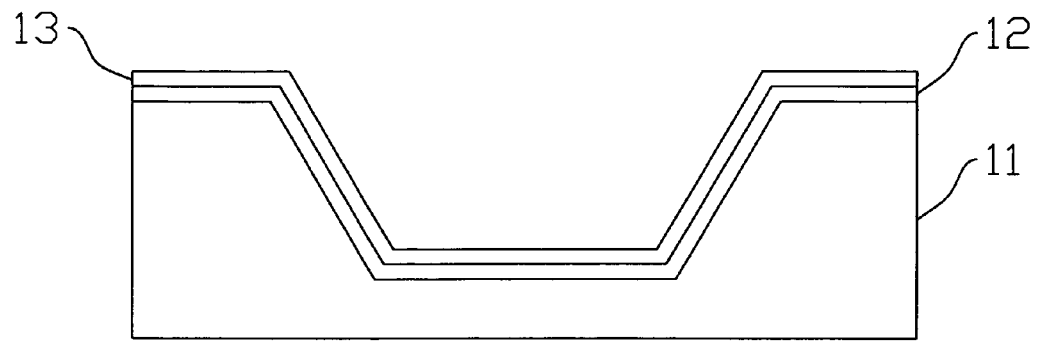
Figure 8E:
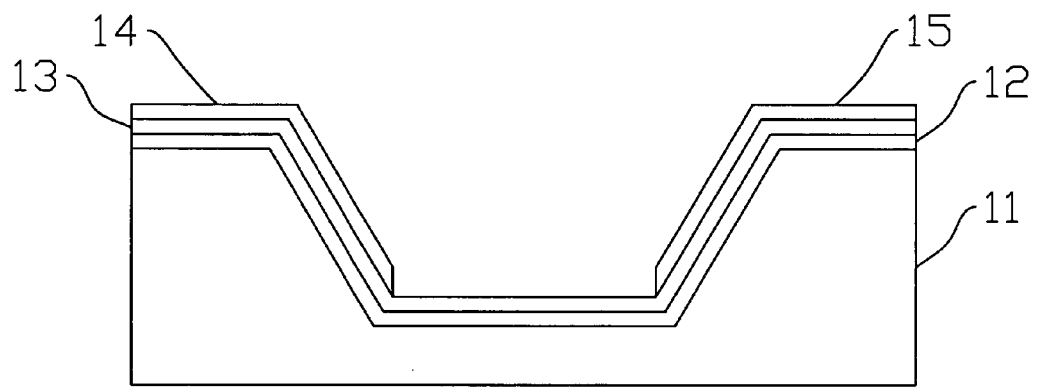
Figure 8F:
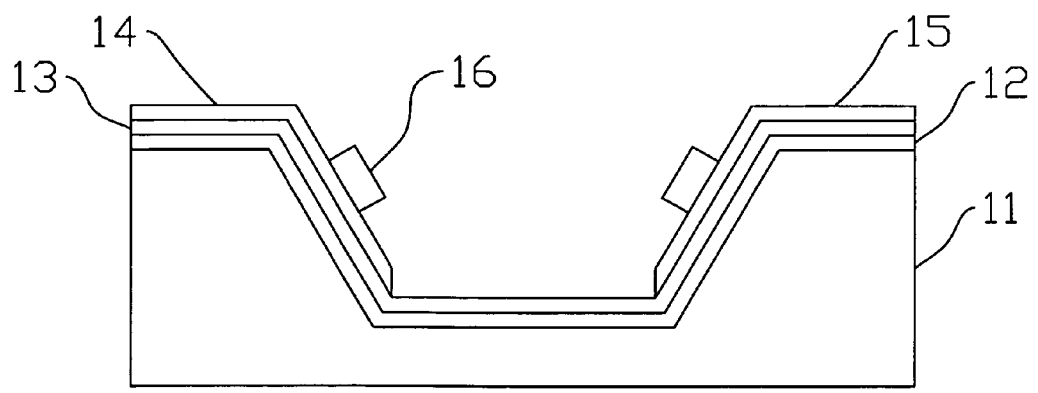
Figure 8G:
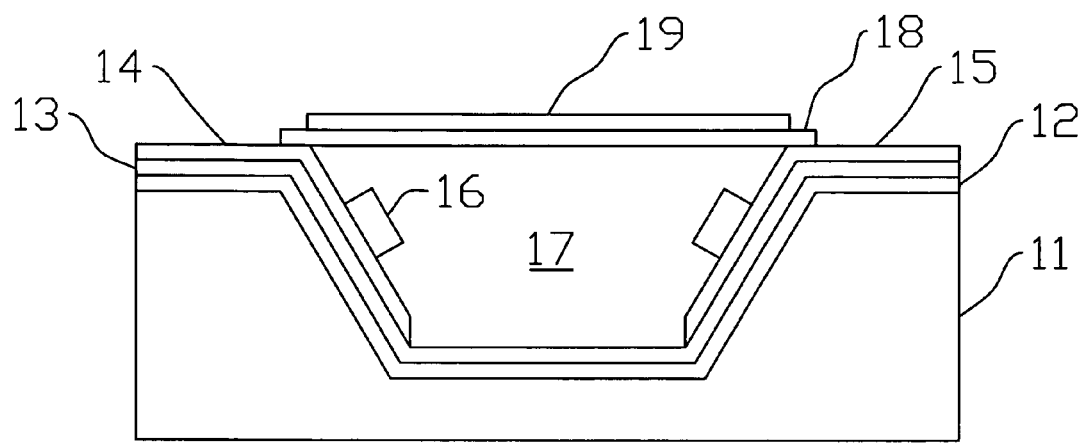
Figure 8H:
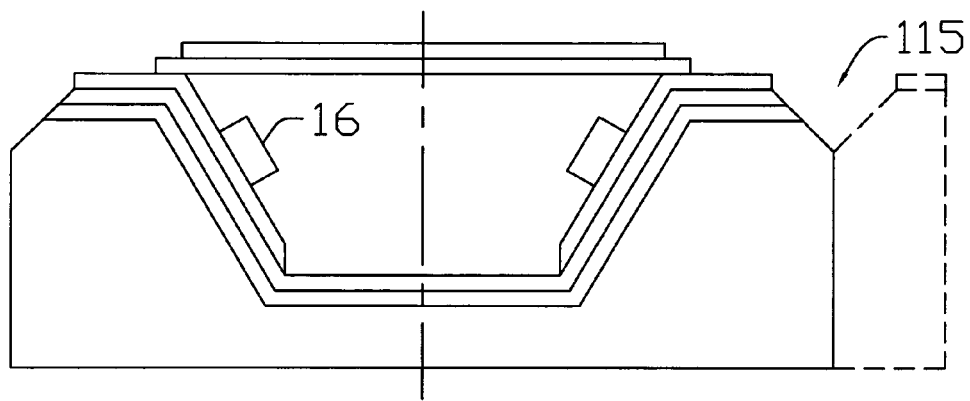
Figure 8I:
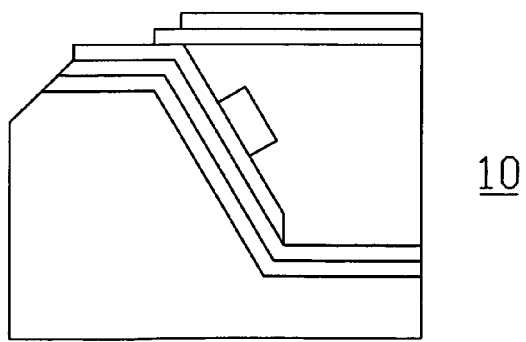

Firstly, as shown in FIG. 8A, a silicon substrate 11 is prepared. As shown in FIGS. 8B~8E, a trench 114 having an upper terrace 111, an incline 112, and lower terrace 113, is then formed by performing an anisotropic-etching on the silicon substrate 11 assisted by an oxide mask (not shown) and KOH etchant. A first reflecting layer 12 and a first insulating layer 13 are sequentially overlaid on the upper terrace 111, the incline 112, and the lower terrace 113. Conducting layers 14 and 15 are then overlaid on the area of the first insulating layer above the upper terrace 111 and the incline 112. The light-emitting unit 16 is mounted on the conducting layer 14 and/or 15, and a wire is bonded thereto according to the requirement. A filling material 17 is filled into the trench 114, and a second insulating layer 18 and a second reflecting layer 19 are sequentially overlaid thereon, as shown in FIGS. 8F and 8G. Finally, after cutting the silicon substrate 11, a separate light-emitting device 10 is obtained. In addition, a cut 115 (the adjacent light-emitting device is shown in dotted lines) is formed before cutting in order to avoid short circuit caused by metallic residuals or the sidewall of the light-emitting unit 16 being polluted by the solder, as shown in FIGS. 8H and 8I. The cut 115 can be also formed before overlaying the first insulating layer 13, i.e. the first insulating layer 13 is covered on the cut 115. In the above description, the thickness of each layer can be identical or varying in view of the manufacture conditions of design requirements.

Figure 9A:
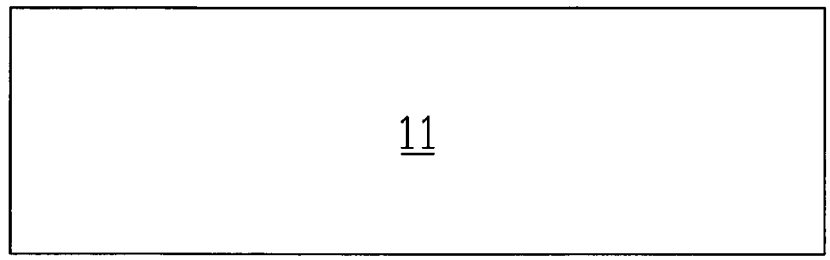
FIGS. 9A~9F illustrate a process flow according to another preferable embodiment of the present invention.
Figure 9B:
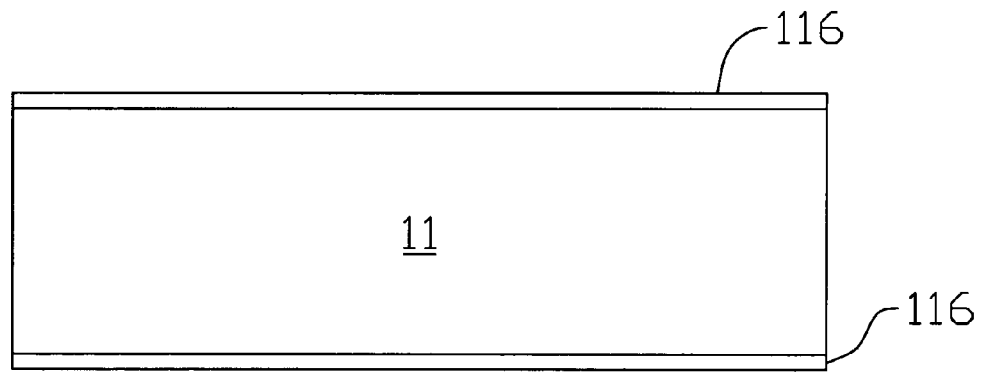
Figure 9C:
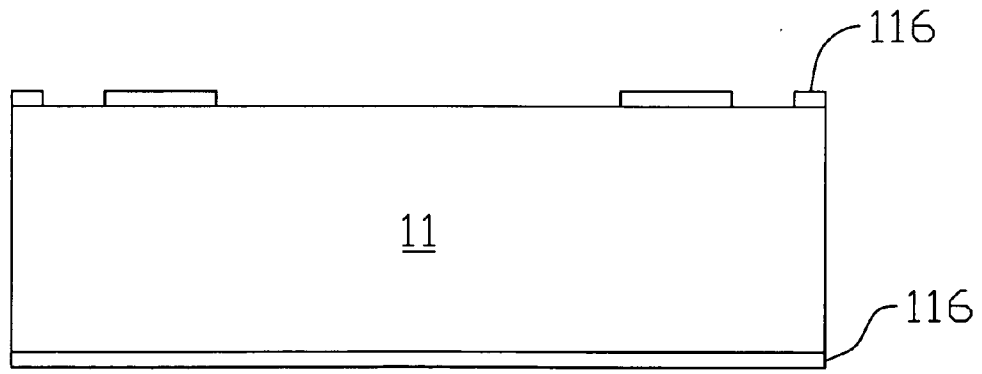
Figure 9D:
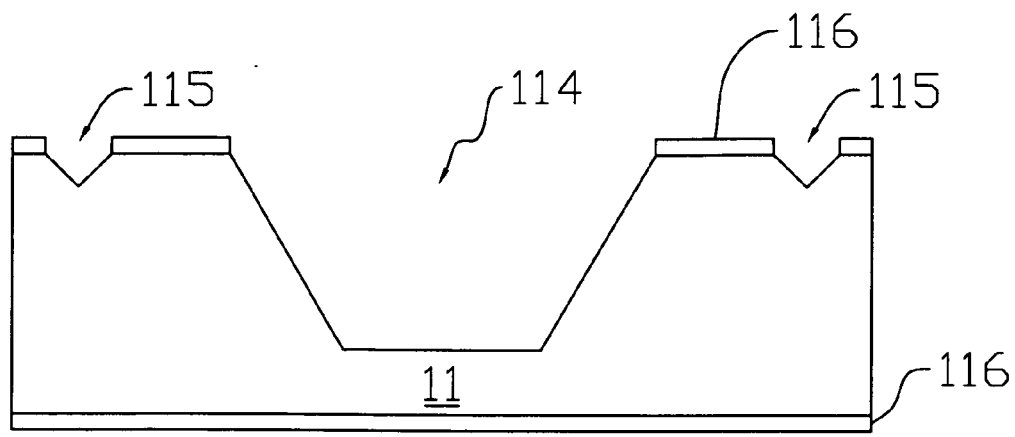
Figure 9E:
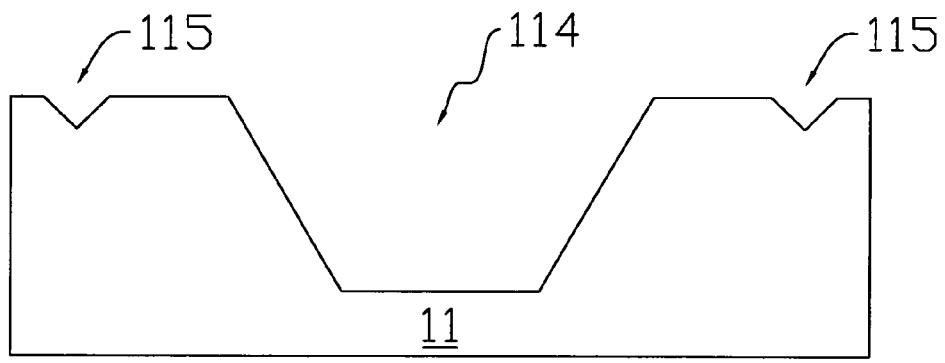
Figure 9F:
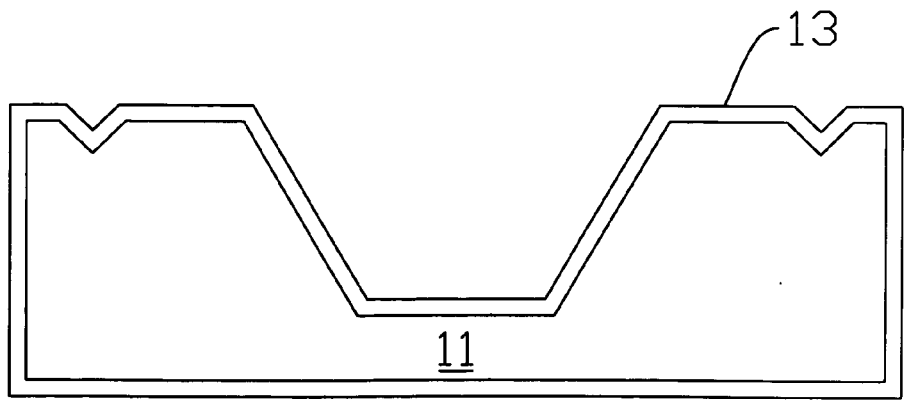
Figure 10:
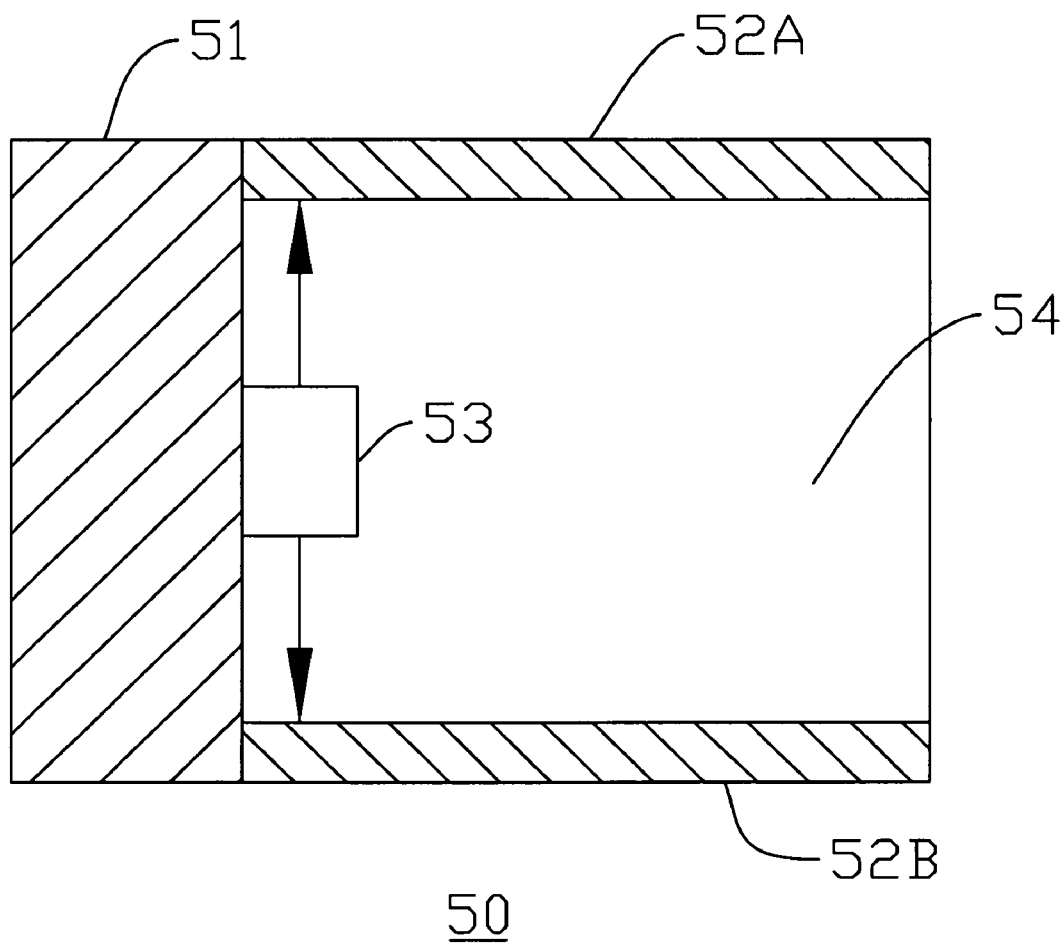
FIG. 10 illustrates a side cross section of a known side view light-emitting diode.

An alternative manufacture process can be used in present invention. As shown in FIGS. 9A and 9B, for example, a $Si_3N_4$ film 116 is firstly formed on a surface of the silicon substrate 11, and then etched to form a pattern. In the case, to provide an easy manufacture process, the $Si_3N_4$ film 116 can be formed simultaneously on the other surfaces of the substrate 11. By adapting the pattern as a mask, the KOH solution is used to etch the substrate 11 to form the trench 114 and the cut 115. The $Si_3N_4$ film 116 is then removed by dry etching. A reaction gas, such as oxygen, is introduced to cause the surface of the silicon substrate 11 to become a silica layer 13. The steps after FIG. 8D are repeated to complete the light-emitting device 10.

The foregoing description has been directed to the specific embodiments of this invention. It will be apparent; however, that other variations and modifications may be made to the embodiments without escaping the spirit and scope of the invention.

What is claimed is:

1. A light-emitting device comprising:
   a light channel formed on a base, comprising:
   an upper surface;
   a lower surface opposite to the upper surface;
   an inner surface intersecting with the upper surface and the lower surface at different intersecting angles; and
   a light output surface opposite to the inner surface and intersecting with the upper surface and the lower surface; and
   a light-emitting unit on the inner surface and emitting light to propagate inside the light channel towards the light output surface.

2. The device of claim 1, further comprising:
   a first reflecting layer covering the inner surface;
   a conducting layer covering the first reflecting layer and electrically connecting to the light-emitting unit; and
   a second reflecting layer on the upper surface.

3. The device of claim 2, further comprising:
   a first insulating layer between the first reflecting layer and the conducting layer.

4. The device of claim 2, further comprising:
   a filling material filling the light channel.

5. The device of claim 1, wherein the light output surface is substantially parallel to the inner surface.

6. The device of claim 1, wherein the light output surface is substantially perpendicular to at least one of the upper surface and the lower surface.

7. The device of claim 1, wherein the light output surface intersects with the upper surface and the lower surface at different intersecting angles.

8. The device of claim 1, wherein the light output surface is a curved surface.

9. The device of claim 1, wherein the upper surface is substantially parallel to the lower surface.

10. The device of claim 1, wherein the light-emitting unit comprises a p-electrode and an n-electrode, each of the two electrodes electrically connecting to a conducting layer formed on the inner surface.

11. The device of claim 1, wherein the light-emitting unit emits two or more colors of lights.

12. The device of claim 1, wherein the light-emitting unit emits red, blue and green lights.

13. The device of claim 1, wherein at least a portion of the inner surface or the lower surface is curved.

14. The device of claim 1, wherein the upper surface comprises a cut.

15. The device of claim 1, further comprising:
    a wavelength converting material for receiving light from the light-emitting unit and generating an excited light.

16. The device of claim 15, wherein the wavelength converting material directly overlays on the light-emitting unit.

17. The device of claim 1, further comprising:
    a light guide for receiving and redirecting light from the light-emitting unit.

18. The device of claim 17, wherein a light input surface of the light guide has a contour corresponding to the light output surface.

19. The device of claim 17, further comprising:
    a reflecting layer, on a side of the light guide, for reflecting light;
    an optical film; and
    a liquid crystal layer;
    wherein the optical film and the liquid crystal layer locates on another side of the light guide.

20. The light-emitting device comprising:
    a light channel comprising:
    an upper surface;
    a lower surface opposite to the upper surface;
    an inner surface, on one end of the light channel, intersecting with the upper surface and the lower surface; and
    a light output surface, on the other end of the channel, being not parallel to the inner surface and intersecting with the upper surface and the lower surface;
    a filling material inside the light channel; and
    a light-emitting unit on the inner surface and emitting light to propagate inside the light channel towards the light output surface.

* * * * *